United States Patent
Liu

(10) Patent No.: US 6,848,610 B2
(45) Date of Patent: Feb. 1, 2005

(54) APPROACHES FOR FLUXLESS SOLDERING

(75) Inventor: Hongwei Liu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/397,686

(22) Filed: Mar. 25, 2003

(65) Prior Publication Data
US 2004/0188496 A1 Sep. 30, 2004

(51) Int. Cl.$^7$ .............................. B23K 1/00; B23K 35/00
(52) U.S. Cl. ...................................... 228/246; 228/56.3
(58) Field of Search ............................... 228/245, 246, 228/56.3, 180.1–180.22; 428/596, 600, 609, 613, 614, 670, 672, 673, 674, 646, 642

(56) References Cited

U.S. PATENT DOCUMENTS

| | | | | |
|---|---|---|---|---|
| 1,248,506 A | * | 12/1917 | Lavine | 428/672 |
| 1,399,769 A | * | 12/1921 | Hodgkinson | 428/572 |
| 2,354,409 A | * | 7/1944 | Strasser | 428/672 |
| 2,362,893 A | * | 11/1944 | Durst | 428/647 |
| 3,593,412 A | * | 7/1971 | Foote | 228/123.1 |
| 4,050,621 A | * | 9/1977 | Bouley | 228/180.1 |
| 4,418,857 A | * | 12/1983 | Ainslie et al. | 228/124.1 |
| 4,774,760 A | * | 10/1988 | Seaman et al. | 29/840 |
| 4,819,857 A | * | 4/1989 | Mizuishi et al. | 228/121 |
| 4,884,335 A | * | 12/1989 | McCoy et al. | 29/839 |
| 5,021,300 A | * | 6/1991 | Stacey | 428/620 |
| 5,242,097 A | * | 9/1993 | Socha | 228/56.3 |
| 5,567,648 A | * | 10/1996 | Gupta | 438/616 |
| 5,820,014 A | * | 10/1998 | Dozier et al. | 228/56.3 |
| 6,186,390 B1 | * | 2/2001 | Tadauchi et al. | 228/56.3 |
| 6,347,901 B1 | * | 2/2002 | Park et al. | 403/270 |

* cited by examiner

Primary Examiner—Kiley S. Stoner
Assistant Examiner—Kevin McHenry
(74) Attorney, Agent, or Firm—Blakely, Sokoloff, Taylor & Zafman LLP

(57) ABSTRACT

Improved fluxless soldering processes are disclosed. In accordance with one technique, a solder preform having a plurality of voids formed on its primary surfaces is disposed between metallized surfaces of a pair of members to be joined. Upon reaching the reflow temperature, fresh solder flows into the voids and wets portions of the metallized surfaces, thus overcoming the solder surface oxidation problem common to fluxless soldering processes. In accordance with another technique, a solder preform having primary surfaces coated with a thin layer of a noble metal is employed. The noble metal substantially prevents oxidation of the solder performs surfaces while the preform is heated to reach reflow temperature. As the solder temperature increases, portions of the noble metal are dissolved into the bulk solder material. Thus, during reflow, non-oxidized bulk solder material is enabled to wet the metallized surfaces of the pair of members.

18 Claims, 3 Drawing Sheets

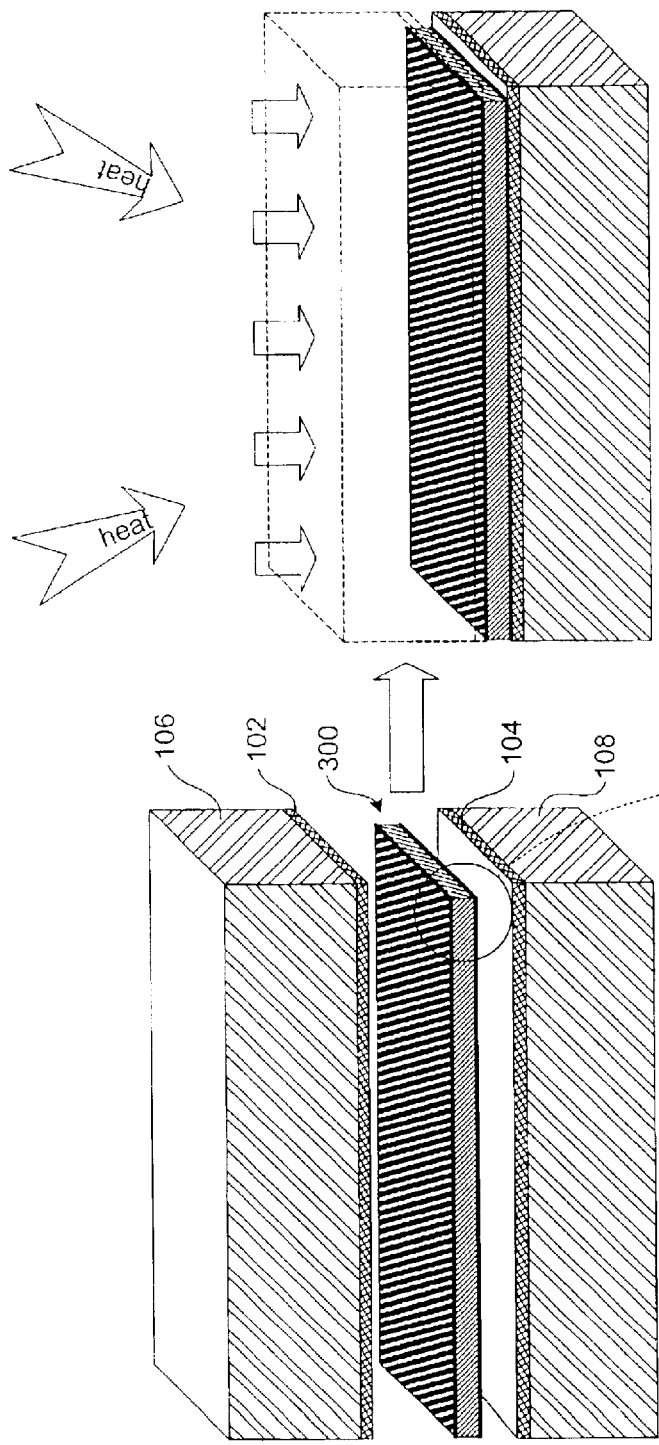

APPROACHES FOR FLUXLESS SOLDERING

FIELD OF THE INVENTION

The field of invention relates generally to soldering and, more specifically but not exclusively relates to fluxless soldering techniques.

BACKGROUND INFORMATION

Solders are special composition metals (known as alloys) that, when in the presence of flux, melt at relatively low temperatures (120–450° C.). The most commonly used solders contain tin and lead as base components. Many alloy variations exist that include two or more of the following metallic elements: tin (Sn), lead (Pb), silver (Ag), bismuth (Bi), antimony (Sb) and copper (Cu). Solder works by melting when it is heated, and bonding (wetting) to metallic surfaces. The solder forms a permanent intermetallic bond between the metals joined, essentially acting like a metal "glue." In addition to providing a bonding function, solder joints also provide an electrical connection between soldered components and a heat transfer path. Solders are available in many forms including paste, wire, bar, ribbon, preforms and ingots.

Generally, metal surfaces have a thin film of oxidation or passivation caused by normal environmental exposure to air and oxygen that acts as a barrier during the soldering process. Accordingly, a chemical product (usually rosin-based) known as "flux" is used to prepare the metal surfaces for soldering by cleaning off oxides, passivation and other contamination. Flux also reduces the surface tension of the solder alloy to promote wetting out over exposed solderable surfaces beyond the initial deposit location. During the preheating stage, the flux is working and the alloy is approaching its melting point. After the solder becomes completely molten, heat is removed to allow re-solidification of the alloy in its new position.

There are four basic flux types to choose from that provide a wide variety of capabilities. No-Clean (NC) flux consists of rosin, solvent, and a small amount of activator. NC flux has low activity and is suited to easily solderable surfaces. NC residue is clear, hard, non-corrosive, non-conductive, and designed to be left on the assembly. Residue may be removed with an appropriate solvent if so desired. Rosin Mildly Activated (RMA) flux consists of rosin, solvent, and a small amount of activator. Most RMA flux is fairly low in activity and best suited to easily solderable surfaces. RMA flux residue is clear, soft, non-corrosive, and non-conductive. Cleaning is optional. Residue may be removed with an appropriate solvent if desired. Rosin activated (RA) flux consists of rosin, solvent, and aggressive activators. RA flux has higher activity than RMA for moderately oxidized surfaces. RA flux residue is corrosive and should be removed as soon as possible after reflow to prevent damage to the assembly. Maximum safe time before cleaning is product dependent. Residue may be removed with an appropriate solvent. Water Soluble (WS) flux consists of organic acids, thixotrope, and solvent. WS flux comes in a range of activity levels for soldering to even the most difficult surfaces. WS flux residue is corrosive and should be removed as soon as possible after reflow to avoid damage to the assembly. The maximum safe time before cleaning is generally product dependent. Typically, residue may be removed with 60° C. (140° F.) water and 40 psi pressure.

A problem with the foregoing conventional soldering approaches is that the use of flux is intolerable under some manufacturing processes. For example, all fluxes, including even NC and RMA fluxes, leave residues containing contaminants that are unsuitable for manufacturing certain types of semiconductor-based assemblies and optical communication equipment. These situations call for the use of fluxless solder assembly techniques.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 3a and 3b respectively show exploded and assembled isometric cross-section views of a fluxless soldering process in which a solder preform having primary surfaces coated with a thin layer of a noble metal is employed in accordance with one embodiment of the invention; and FIG. 3c shows a detailed view of the solder preform of FIGS. 3a and 3b.

DETAILED DESCRIPTION OF PREFERRED EMBODIMENTS

Embodiments of improved fluxless soldering processes and solder preforms employed in the processes are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As discussed above, in most soldering processes an appropriate flux is employed to reduce the adverse effects of metal oxidation and to improve metal "wetting." However, the processing enhancements provided by flux are not available in environments in which flux may not be used. One way that this problem is addressed is to use "fluxless" soldering processes. Under such approaches, two metal surfaces are bonded together using an appropriate solder alloy without the use of flux. Since solder does not flow as well in fluxless environments, it is often advantageous to use solder preforms, which generally comprise solder configured in relatively thin shapes corresponding to predefined patterns defining where solder is to be placed between various assembled components.

Figures 1A, 1B:
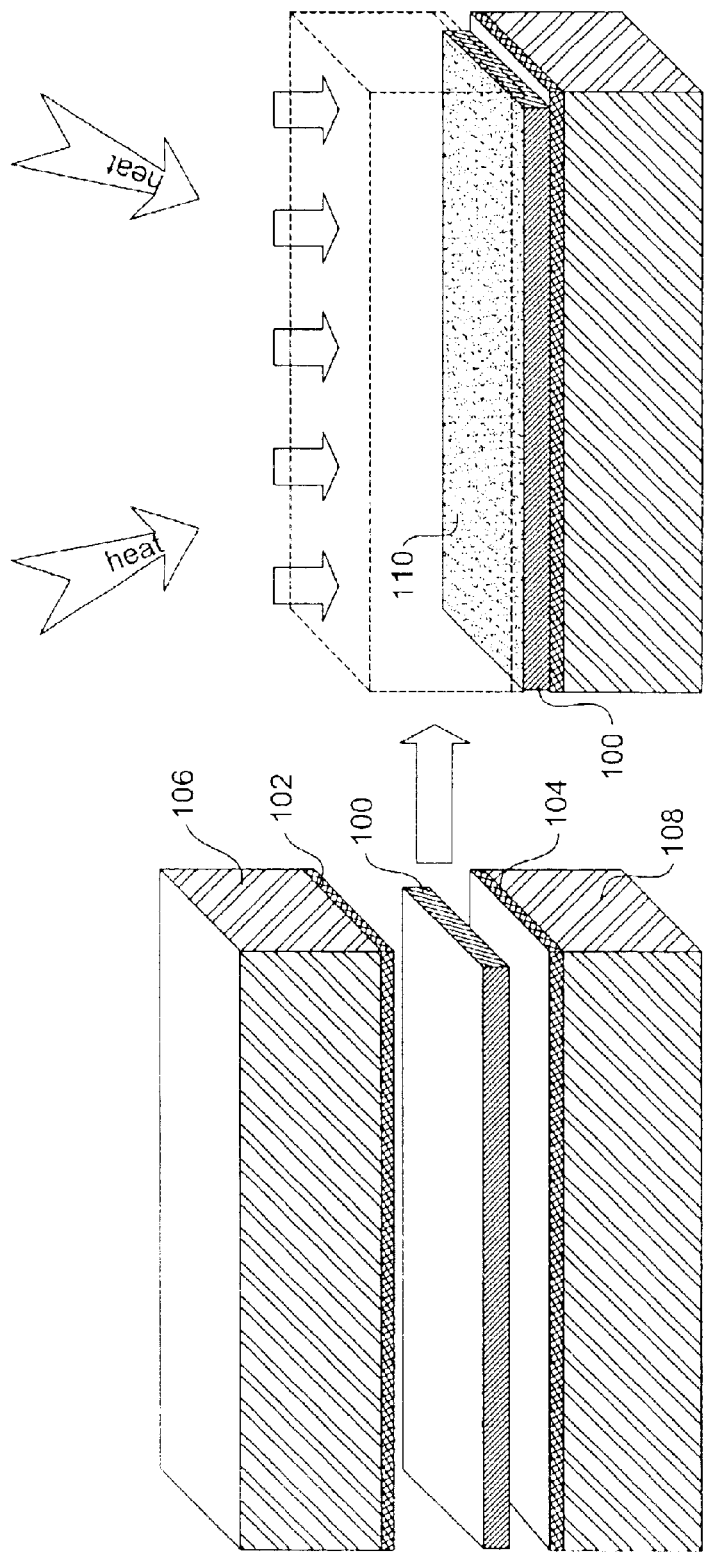
FIGS. 1a and 1b respectively show exploded and assembled isometric cross-section views of a fluxless soldering process in which a conventional solder preform is used.

For example, a typical fluxless soldering process implemented through use of a solder preform 100 is shown in FIGS. 1a and 1b. The object of a solder preform process is to join metallized surfaces of two members (i.e., components) disposed on opposite sides of the solder preform. Generally, the entire member(s), including the metallized surfaces may comprise an integral portion of one or both members, or may comprise a metal layer formed over the surface of one or both members, such as depicted by metallized surfaces 102 and 104, which respectfully comprise metallic layers formed on members 106 and 108. Typically, the metallized layers are formed from a metal that works well with soldered joints, such as copper, silver, or gold. Oftentimes, one of these metals is applied over a nickel member, for example.

As shown in FIG. 1b, during the fluxless soldering process the two members 106 and 108 are urged toward each other, thereby sandwiching solder preform 100. This may be performed by applying an external force to one or both members, or, more typically, results from the force of gravity acting on the upper member.

At the same time, heat is applied to the environment surrounding the members. The heat raises the temperature of the solder (and usually the members as well, particularly metallized surfaces 102 and 104). Upon application of sufficient heat, the solder in solder preform 100 begins to melt, adhering to metallized surfaces 102 and 104. This is commonly referred to as solder reflow, and the temperature at which the solder melts is termed the "reflow temperature." Upon cooling, the melted solder solidifies, forming a solder bond between the metallized surfaces of members 106 and 108, thus bonding the two member.

As discussed above, during a "normal" soldering process an appropriate solder flux is employed to assist in wetting the metallic surfaces, and overcoming problems such as surface oxidation of such surfaces. However, some manufacturing processes dictate that no solder flux be employed. This requires a fluxless soldering process to be used, which often results in poor joint quality.

The primary cause of the poor joint quality results from metal oxidation, which becomes particularly acute at higher temperatures. At elevated temperatures, oxygen molecules more readily react with corresponding molecules on the surfaces of many metals, such as aluminum, nickel, tin, steels, etc. to form metal oxides. The metal oxides act as an insulating barrier, reducing the heat transfer (thermal conductivity) between the joined surfaces. The insulating barrier also prevents bulk solder material from migrating to the metallized surfaces. Both of these characteristics lead to a poor adhesion interface.

One technique for addressing the foregoing problem is to select an oxide-resistant material for the metallized surfaces, such as gold. Although this overcomes the problem of forming an oxidized layer at the solder/metallic layer interface on the metallic side, other problems may result, such as the $AuSn_4$ problem discussed below. Furthermore, an oxidation problem still exists for the solder preform surface itself, as illustrated by an oxidized layer 110 formed on solder preform 100 in FIG. 1b. For example, in the case of tin-based solders, a layer of tin oxide is formed on the surfaces of the preform.

Other conventional techniques for addressing the surface oxidation problem include performing reflow operations in an evacuated environment or in the presence of an inert gas (e.g., nitrogen). Under these techniques, the oxidation problem is substantially reduced or eliminated by removing oxygen from the environment. Although useful, there are many soldering processes in which evacuation or the use of an inert gas environment is impossible or impractical.

Figure 2A:
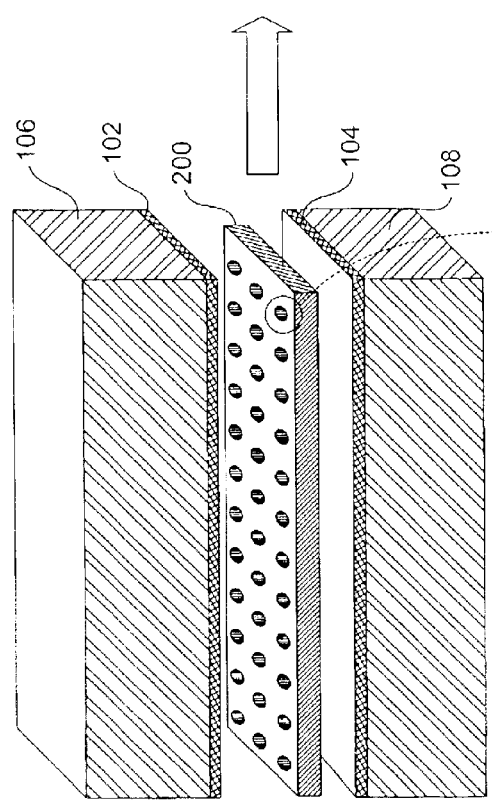
FIGS. 2a and 2b respectively show exploded and assembled isometric cross-section views of a fluxless soldering process in which a solder preform having a plurality of voids formed in its primary surfaces is employed in accordance with one embodiment of the invention.
Figure 2C:
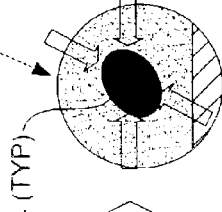
FIGS. 2c and 2d respectively comprises detailed views of a typical void formed in the solder preform of FIGS. 2a and 2b before and after the solder reflow temperature is reached.
Figure 2B:
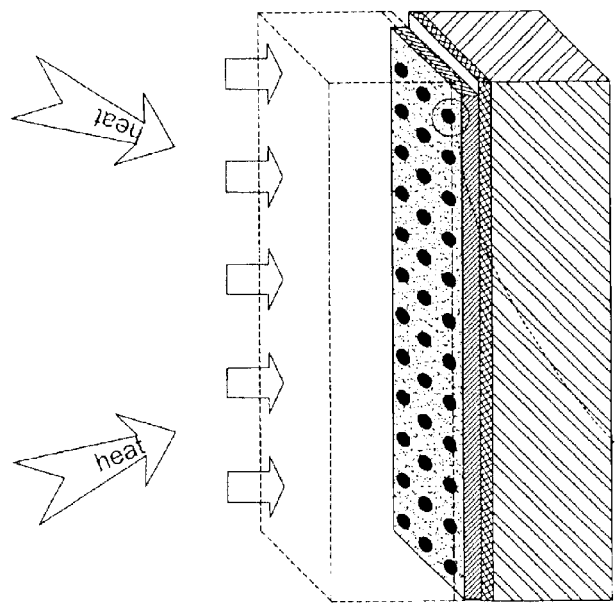
Figure 2D:
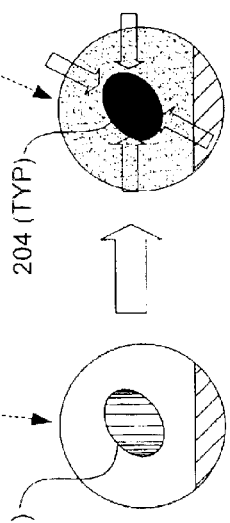

In accordance with one embodiment of the invention, the solder preform oxidation problem is addressed by employing a solder preform that includes a plurality of voids 202 formed in its primary surfaces of the preform, such as depicted by a solder preform 200 in FIGS. 2a and 2b. (As used herein, the primary surfaces of a solder preform refer to the surfaces that come into contact with the metallized surfaces of the joined members during the soldering process). As the solder preform is heated, oxidation forms on the surface, as before, including the inside surfaces of the voids. However, when the solder begins to reflow, fresh solder 204 overcomes the surface oxidation layer and flows from the bulk material into the voids. The fresh solder is further forced, through hydrostatic pressure, into contact with metallized surfaces 102 and 104, thus wetting the metallized surfaces in the areas proximate to the voids. At the same time, the thickness of the solder preform is reduced, as a function of the amount of fresh solder that fills the voids. Since the fresh solder does not have an oxidized surface (once it melts), its wetting and adhesion characteristics are vastly improved over the oxidized portions of the preform. Upon cooling, the fresh solder melds with the adjacent solder areas, bonding the bulk solder to the metallized surfaces, thereby creating an improved solder bond between members 106 and 108.

Generally, voids 202 comprise indentations or through holes formed in the bulk solder preform material. The particular shape of the void is usually not a controlling characteristics, although if indentations are employed, they should be formed at sufficient depth to provide an adequate amount of fresh solder. For example, the holes or indentations may include circular, square, oval, triangular, hexagonal, and other shapes. Typically, the voids will be configured in a pattern, such as illustrated by the orthogonal grid pattern in FIGS. 2a and 2b. In other instances, the particular location of the voids may depend on the solder preform configuration and other soldering process parameters. Generally, the voids may be formed using well-known manufacturing techniques, such as punching, machining, etching, die-pressing, casting etc. The optimum size, spacing, and density of the void pattern will generally depend on the particular application in which the perforated solder preform is used. Overall, the voids should be sized to ensure that a sufficient amount of fresh solder flows from the bulk solder material into the voids under the particular soldering process conditions in which the preform is employed. These conditions typically include forces applied to the solder preform surfaces (e.g., due from weight of an upper component or external force applied to the components to be joined), environment temperature, and solder reflow characteristics, as well as other potential considerations that will be known to those skilled in the solder processing art. Additionally, the thickness of the solder preform may be considered in determining the void size.

In cases in which a void pattern is used, the density of the pattern relates to the relative area of the primary surfaces that is occupied by the voids vs. the total area of the preform's primary surfaces if the voids did not exist. Again, the particular density that will be optimum for a given application will be dependent on specific characteristics of the application, with the goal of ensuring sufficient fresh solder flows into the voids. Under most conditions the density will be less than 50%.

In accordance with a second technique for improving solder bonds in a fluxless environment, a thin layer of a noble metal is formed on the solder preform, such as depicted by a solder preform 300 including a bulk solder core 301 and noble metal layers 302 in FIGS. 3a–3c. As discussed above, the surface of most metals become oxidized when exposed to elevated temperatures in an oxygen-enriched environment (e.g., air). However, certain metals, commonly termed "noble" metals, substantially resist oxidation. The noble metals include Copper (Cu), Silver (Ag), Gold (Au), Platinum (Pt), Palladium (Pd) and sometimes Iridium (Ir). Generally, Gold, Platinum, and Palladium are considered the most oxidation resistant noble metals, while copper and silver provide lesser resistance.

The reason for the oxidation-resistance of noble metals is because the number of electrons in their outer shells (i.e., valance electrons) is very small (0 for non-isotope Palladium, 1 for Cu, Ag, Au, and Pt, and 2 for Ir). Since valance electrons of a given element (e.g., a metal) react with valance electrons of another element (e.g., the electrons in the outer shell of the oxygen atoms/molecules) to form compounds via covalent bonds, the lack of available valance electrons in the noble metals greatly reduces or eliminates the formation of oxides on their surfaces.

At first glance, it may appear counterintuitive to apply a noble metal layer to solder to enhance fluxless solder processes. This is because the melting temperature of a noble metal is much higher than the melting temperature of the solder (typically a tin/lead (Sn/Pb) eutectic, although various other solder compounds containing elements including silver, antimony (Sb), bismuth (bi) and indium (In) are also commonly used). Thus, one would expect the noble metal to form a barrier between the bulk solder material and the metallized surfaces of the components that are to be joined. However, in the case of gold, for example, as the bulk solder approaches its reflow temperature, gold begin to dissolve into the solder. Furthermore, at the reflow temperature the gold is substantially dissolved, enabling the bulk solder to freely wet the metallized surfaces of the components to be joined. At the same time, the thin noble metal layer substantially eliminates the formation of oxide on the surfaces of the solder preform prior to reflow. The net result is an improved fluxless solder process.

It is noted that one needs to carefully consider the thickness of the noble metal to ensure it provides a benefit rather than a detriment to the process. For example, it is known that gold films are readily dissolved in tin-based alloys. At normal reflow temperatures, a typical lead/tin alloy of having a weight ratio of 60/40 dissolves gold film at a rate of 1 $\mu$m/second (see Table 1 below). Once the gold content of the solder joint exceeds ~5 wt. %, $AuSn_4$ crystals form within the solder. The $AuSn_4$ phase embrittles the solder joint, often leading to premature failure. This problem is particularly common in cases of extreme temperature cycling.

On the flip side, the thickness of the noble metal layer should be sufficient to both (substantially) prevent oxidation from forming during the solder process and to provide a sufficient shelf life for the solder preforms. The latter consideration concerns the fact that the gold layer will react with other elements and compounds over time, reducing its thickness and, therefore, its effectiveness.

A further consideration involves chemical reactions that may take place during the heating of the solder. For example, the temperature of the melting point of the solder may change, as depicted in Table 1 below:

TABLE 1

| Solder Composition (Wt. %) | Wt % Au to form $AuSn_4$ | Wt % Au Dissolved in solder @ 50° C. superheat | Melt point change w/1 wt. % Au dissolved in Alloy |
|---|---|---|---|
| 57 Bi 43 Sn | 0.8 | 4 | −2 |
| 60 Pb 40 Sn | 5 | 13 | −12 |
| 96 Sn 4 Ag | 10 | 30 | −15 |
| Pure Sn | 10 | 30 | −15 |

Indium-based solders (indium/lead, indium/silver, indium/lead/silver) are good alternatives to tin-based solders when soldering to gold films. While gold will dissolve into indium solder compounds, the layer formed at the joint interface, $AuIn_2$ does not cause the brittleness associated with $AuSn_4$. Furthermore, the layer acts as a barrier to further dissolution of the gold film. However, while indium alloys have favorable mechanical properties when used to make joints on gold films, wetting and corrosion resistance can be a challenge when compared with more conventional solder materials.

Typically, the thickness of the layer of the noble metal will be a few microns or less, or even in the sub-micron range. The appropriate thickness will generally be dependant on various process and component parameters, including the solder allow, the noble metal used, the constituents of the members to be joined (e.g., the metallization layer element/compound), heat transfer rates, soldering environment, etc.).

The noble metal may be applied to the solder preform in one of several common techniques for applying a thin metallic layer to a metal compound. These techniques include but are not limited to vapor deposition, sputtering, plating, and laminating.

In another embodiment, the features of the embodiments discussed above are combined. In this instance, a thin noble metal layer is formed on a perforated solder preform. Optionally, the noble metal layer may first be applied to the preform, and then a void forming process is employed to produce the voids. The net result is a perforated solder preform having a thin noble metal layer formed over its primary surfaces.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be constructed in accordance with established doctrines of claim interpretation.

What is claimed is:

1. A solder perform, comprising:
   a preform of bulk solder, formed into a pre-determined shape having a first and second primary surfaces disposed on opposite sides thereof; and
   a layer of metal formed on said first and second surfaces, said metal comprising at least one of gold, platinum and palladium.

2. The solder preform of claim 1, wherein the bulk solder comprises a tin-based solder.

3. The solder perform of claim 1, wherein the bulk solder comprises an indium-based solder.

4. A solder perform, comprising:
   a preform of bulk solder, formed into a pre-determined shape having a first and second primary surfaces disposed on opposite sides and having a plurality of voids formed therein; and
   a layer of metal formed on said first and second surfaces, said metal comprising a noble metal.

5. The solder preform of claim 4, wherein said plurality of voids comprise a plurality of through holes passing through from the first primary surface to second primary surface.

6. The solder preform of claim 4, wherein said plurality of voids comprise a plurality of indentations formed in the first and second primary surfaces.

7. The solder preform of claim 4, wherein said plurality of voids are arranged in a pattern.

8. A solder perform, comprising:
   a preform of bulk solder, formed into a pre-determined shape having a first and second primary surfaces disposed on opposite sides thereof; and
   a layer of metal formed on said first and second surfaces, said metal comprising a noble metal having a thickness of less than 1 micron.

9. A fluxless soldering process, comprising:
   disposing a solder preform between respective metallized surfaces of first and second members to be joined, said solder preform comprising a preform of bulk solder formed into a pre-determined shape having a first and second primary surfaces disposed on opposite sides thereof and having a plurality of holes passing through the solder preform from the first primary surface to the second primary surface;
   heating the solder preform and the first and second members to cause the bulk solder in the solder preform to melt, wherein a portion of fresh solder is caused to fill the voids and wet the surfaces of the first and second members; and
   cooling the first and second members.

10. The fluxless soldering process of claim 9, wherein said plurality of holes are substantially circular in shape.

11. The fluxless soldering process of claim 9, further comprising applying a force to urge the metallized surfaces of the first and second members toward each other, causing a force to be applied across the primary surfaces of the solder preform.

12. A fluxless soldering process, comprising:
   disposing a solder preform between respective metallized surfaces of first and second members to be joined, said solder preform comprising a preform of bulk solder formed into a pre-determined shape having a first and second primary surfaces disposed on opposite sides thereof, each primary surface having a layer of metal formed thereon comprising at least one of gold, platinum and palladium;
   heating the solder preform to a reflow temperature to cause the bulk solder in the solder preform to melt, wherein the layer of noble metal is substantially dissolved into the bulk solder enabling portions of the bulk solder to wet the metallized surfaces of the first and second members; and
   cooling the first and second members.

13. The fluxless soldering process of claim 12, wherein the bulk solder comprises a tin-based solder.

14. The fluxless soldering process of claim 12, wherein the bulk solder comprises an indium-based solder.

15. A fluxless soldering process, comprising:
   disposing a solder preform between respective metallized surfaces of first and second members to be joined, said solder preform comprising a preform of bulk solder formed into a pre-determined shape having a first and second primary surfaces disposed on opposite sides thereof, each primary surface having a layer of a noble metal metal formed thereon and having a plurality of voids formed therein;
   heating the solder preform to a reflow temperature to cause the bulk solder in the solder preform to melt, wherein the layer of noble metal is substantially dissolved into the bulk solder enabling portions of the bulk solder to wet the metallized surfaces of the first and second members and the plurality of voids being filled with fresh solder that wets portions of the metallized surfaces when the solder melts; and
   cooling the first and second members.

16. The fluxless soldering process of claim 15, wherein said plurality of voids comprise a plurality of holes passing through the solder preform from the first primary surface to the second primary surface.

17. The fluxless soldering process of claim 16, wherein said plurality of voids comprise a plurality of indentations formed in each of the first and second primary surfaces.

18. The fluxless soldering process of claim 12, further comprising applying a force to urge the metallized surfaces of the first and second members toward each other, causing a force to be applied across the primary surfaces of the solder preform.

* * * * *